United States Patent [19]
Inada et al.

[11] Patent Number: 5,646,096
[45] Date of Patent: Jul. 8, 1997

[54] PROCESS FOR FABRICATION SUPERCONDUCTING WIRING LINES

[75] Inventors: Hiroshi Inada; Takao Nakamura; Mitchimoto Iiyama, all of Osaka, Japan

[73] Assignee: Sumitomo Electric Industries, Ltd., Japan

[21] Appl. No.: 472,641

[22] Filed: Jun. 7, 1995

Related U.S. Application Data

[62] Division of Ser. No. 798,232, Nov. 1, 1991.

[30] Foreign Application Priority Data

Nov. 1, 1990 [JP] Japan ................................. 2-295661
Nov. 7, 1990 [JP] Japan ................................. 2-301311

[51] Int. Cl.$^6$ ........................... H01L 39/24; B05D 5/12
[52] U.S. Cl. ..................... 505/430; 505/410; 505/230; 505/703; 505/234; 427/62; 427/63
[58] Field of Search ..................... 505/330, 329, 505/410, 430, 191, 234, 230, 703; 257/663, 662; 437/62, 63

[56] References Cited

U.S. PATENT DOCUMENTS

| | | |
|---|---|---|
| 4,900,709 | 2/1990 | Heijman et al. ................ 505/1 |
| 5,081,070 | 1/1992 | Yokoyama et al. |
| 5,096,882 | 3/1992 | Kato et al. ....................... 505/1 |
| 5,126,315 | 6/1992 | Nishino et al. |
| 5,135,908 | 8/1992 | Yang et al. |

FOREIGN PATENT DOCUMENTS

| | | |
|---|---|---|
| 0358879A2 | 3/1990 | European Pat. Off. |
| 63-27643 | 11/1988 | Japan |
| 01-11349 | 1/1989 | Japan |
| 1-181444 | 7/1989 | Japan |
| 2-244512 | 9/1990 | Japan |

*Primary Examiner*—Roy V. King
*Attorney, Agent, or Firm*—Beveridge, DeGrandi, Weilcher & Young, L.L.P.

[57] ABSTRACT

Patterned superconducting wiring lines each consisting of a portion of a thin film of an oxide superconductor deposited on a flat substrate, the portion having a predetermined crystal orientation (a-axis or c-axis orientation) with respect to a flat surface of the substrate, remaining portions of the thin film of the oxide superconductor having a different crystal orientation (c-axis or a-axis orientation) from the portion and/or consisting of an insulation zones. Both of the portion and the remaining portions have a substantially identical thickness so that the thin film has a substantially flat planar surface.

5 Claims, 7 Drawing Sheets

PROCESS FOR FABRICATION SUPERCONDUCTING WIRING LINES

This application is a divisional of co-pending Ser. No. 07/798,232 filed on Nov. 1, 1991, which is incorporated entirely herein reference.

BACKGROUND OF THE INVENTION

1. Field of the Invention

The present invention relates to a superconducting circuit, more particularly to novel patterned superconducting wiring lines each made of a thin film of oxide superconductor deposited on a substrate and a process for fabricating the same.

2. Description of the related arts

The conventional superconductors exhibit the superconductive phenomenon only at extremely low temperature so that it has not been expected to be used in actual applications. In 1986, however, new oxide type superconductors of $[La, Ba]_2CuO_4$ and $[La, Sr]_2CuO_4$ were discovered and after then, discovery of the other superconducting compound oxides such as Y-Ba-Cu-O system or Bi-Ca-Sr-Cu-O system was continued. In these newly discovered oxide superconductors, the superconductive phenomenon can be realized with relatively cheaper liquid nitrogen and hence the possibility of an actual utilization of the high Tc superconductors have burst onto the scene.

Although these oxide superconductors were obtained initially in a bulk form of sintered block by powder sintering technique, now it becomes possible to prepare their thin films of high quality by physical vapour deposition or chemical vapour deposition techniques. The thin films of oxide superconductor are expected to be used in a variety of applications such as sensors, SQUID, superconducting devices including superconducting transistors and Josephson devices. In this specification, the term "oxide superconductor" means any high-Tc compound oxide which show the critical temperature of above 30 K.

In superconducting circuits having superconducting wiring lines, it is desirable to integrate patterned superconducting wiring lines in the same thin film of oxide superconductor as is used to fabricate the superconducting elements or devices. However, how to fabricate the patterned superconducting wiring lines in an integrated circuit have not been established.

It is known that the critical current density of oxide superconductor depend on the orientation of crystals of which a thin film of oxide superconductor is made and that the crystal possess anisotropy. This anisotropy limits the structure of a superconducting circuit including superconducting wiring lines made of a thin film of oxide superconductor.

An object of the present invention is to solve the problem and provides a novel structure of patterned superconducting wiring lines each made of a thin film of oxide superconductor deposited on a substrate and a process for fabricating the same, in order to increase the freedom of circuit designing and to make the best use of high Tc oxide superconductor.

SUMMARY OF THE INVENTION

The present invention provides patterned superconducting wiring lines, characterized in that each of the superconducting wiring lines consists of a portion of a thin film of an oxide superconductor deposited on a flat substrate, the portion having a predetermined crystal orientation with respect to a flat surface of the substrate, remaining portions of the thin film of the oxide superconductor having a different crystal orientation from the portion, and both of the portion and the remaining portions having a substantially identical thickness so that the thin film has a substantially flat planar surface.

The terms "a-axis", "b-axis" and "c-axis" are crystal axes of a. crystal, as are usually used in the crystallography and they are known and determined in crystalline oxide superconductors to which the present invention is applicable.

Orientation of these axes is usually defined by the direction of the crystal axis with respect to a surface of the substrate. For example, "a-axis oriented thin film" is a thin film whose a-axis is perpendicular to the surface of substrate.

The superconducting circuit having superconducting wiring lines according to the present invention can be fabricated by using any oxide superconductor including compound oxide superconductors such as Y-Ba-Cu-O system, Bi-Sr-Ca-Cu-O system and T1-Ba-Ca-Cu-O system.

The substrate on which the thin film of oxide superconductor is deposited is preferably a single crystalline substrate of oxide such as MgO, $SrTiO_3$, $CdNdAlO_4$ or the like. The substrate may be a semiconductor substrate such as silicon substrate having or not having an insulating layer or buffer layer.

Each of the portions can be made of a c-axis oriented thin film or an a-axis oriented thin film. Or, one of the portions can be made of an a-axis oriented thin film and another one of the portions can be made of a c-axis oriented thin film. In a variation, the portion is made of a c-axis oriented thin film and the remaining portion is made of an a-axis oriented thin film. The remaining portion can be made of non-superconductor.

The superconducting wiring lines can have an upper insulation layer thereon. In a special application, the upper insulation layer has preferably a thickness of less than 10 nm. In another variation, another thin film of oxide superconductor is deposited on the upper insulation layer.

In a first embodiment, the present invention provides a superconducting circuit including superconducting wiring lines each made of a thin film of oxide superconductor deposited on a substrate, characterized in that the superconducting wiring lines consist of at least one first superconducting line and at least one second superconducting line both being made of an identical oxide superconductor, each of the first superconducting line consists of a thin film of the oxide superconductor whose c-axis is oriented perpendicularly to a surface of the substrate so that superconducting current flow in parallel with the surface of the substrate, and each of the second superconducting line consists of a thin film of the same oxide superconductor whose c-axis is oriented perpendicularly to the first superconducting line and in parallel with the surface of the substrate so that superconducting current flow perpendicularly to and/or in parallel with the surface of the substrate.

The thin film of the oxide superconductor in which the first and second superconducting wiring lines are included can have viaholes additionally. The thin film in which the first and second superconducting wiring lines are included can have further insulator zones which have a thickness substantially equal to that of the superconducting wiring lines so that the thin film has a substantially flat planar surface.

The present invention provides a process for fabricating the superconducting circuit having the superconducting wiring lines of the first embodiment, characterized by the steps of depositing a first thin film of an oxide superconductor whose a-axis or c-axis is oriented perpendicularly to a surface of the substrate, removing predetermined areas of the first thin film to leave patterned first superconducting lines, and depositing a second thin film of the same oxide superconductor in such a condition that the second thin film becomes an a-axis oriented or c-axis oriented thin film which is oriented differently from the first thin film on the surface of the substrate at remaining areas in which the first thin films are removed.

In a preferred embodiment of the first process, the superconducting wiring lines are produced by the steps of of depositing a first thin film of an oxide superconductor whose c-axis is oriented perpendicularly to a surface of the substrate, removing predetermined areas of the first thin film to leave patterned first superconducting wiring lines, and depositing a second thin film of the same oxide superconductor on exposed surface of the substrate where the first thin film has been removed to produce second superconducting wiring lines, the c-axis of the second thin film being oriented perpendicularly to the first superconducting wiring lines and in parallel with the surface of the substrate so that superconducting current in the second superconducting wiring lines flow perpendicularly to and/or in parallel with the surface of the substrate.

In a second embodiment, the present invention provides a superconducting circuit having superconducting wiring lines each made of a thin film of oxide superconductor deposited on a substrate, comprising first superconducting wiring lines each consisting of a thin film of an oxide superconductor whose c-axis is oriented perpendicularly to a surface of the substrate so that superconducting current flow in parallel with the surface of the substrate, and shield zones each consisting of a thin film of the same oxide superconductor whose a-axis is oriented perpendicularly to the surface of the substrate and whose b-axis is oriented in parallel with the direction of a current which propagates in the superconducting wiring line.

The superconducting circuit can have second superconducting wiring lines each extending perpendicularly to the first superconducting wiring lines, and insulation zone being arranged between the second superconducting wiring line and the shield zone.

The present invention provides a process for fabricating the superconducting circuit having the superconducting wiring lines of the second embodiment, characterized by the steps of depositing a first thin film of an oxide superconductor whose a-axis or c-axis is oriented perpendicularly to a surface of the substrate, removing predetermined areas of the first thin film to leave patterned first superconducting lines, depositing a second thin film of the oxide superconductor in such a condition that the second thin film becomes an a-axis oriented or c-axis oriented thin film which is oriented differently from the first thin film on the surface of the substrate at remaining areas where the first thin films are removed, and forming insulation zones at predetermined portions of the thin film, each of the portion corresponding to an interface between the second superconducting wiring line and the shield zone.

The insulation zone can be produced by deoxygenation treatment which can be effected in a vacuum chamber or by a laser beam or a focussed ion beam.

An essence of the superconducting circuit according to the present invention resides in that each of superconducting wiring lines is made of a thin film of an oxide superconductor which is juxtaposed in a single layer and can have a specific crystal orientation. In other words, in the present invention, the superconducting circuit including all superconducting wiring lines has a substantially flat planar surface.

As stated above, the thin film of oxide superconductor shows anisotropy in the current property due to the anisotropy in crystal. In fact, a great value of current flows along a direction which is perpendicular to the c-axis but only extremely limited critical current flow along a direction of the c-axis.

The superconducting circuit according to first embodiment of the. present invention has such a novel structure that both of the a-axis oriented thin film and the c-axis oriented thin film are co-exist in one layer, in other words two superconducting wiring lines are juxtaposed on a surface of a substrate. Substantially no current flow between these two superconducting lines even if these two thin films of a-axis oriented thin film and c-axis oriented thin film are juxtaposed or deposited side by side, because no substantial current is propagated between these two thin films.

This novel structure of superconducting circuit according to the present invention permits to realize the mostly compacted wiring pattern since both of superconducting wiring lines made of the a-axis oriented thin film and superconducting wiring lines made of the c-axis oriented thin film can be juxtaposed on a common surface of a substrate in the mostly compacted condition which could not be done in the case of metal conductors.

In the superconducting circuit according to the present invention, the superconducting wiring lines made of a-axis oriented thin film are used to propagate an electric current along a direction which is perpendicular to the surface of the substrate, in other words, they function as connection lines between two adjacent layers deposited one over another, while the superconducting lines made of c-axis oriented thin film are used to pass an electric current along a direction which is in parallel with the surface of the substrate.

The superconducting circuit having superconducting wiring lines according to the present invention can be made up in a form of a multi-layered superconducting circuit. In this case also each layer can have the superconducting wiring lines as well as viaholes which are juxtaposed on a common plane in the mostly compacted layout The superconducting circuit having the superconducting wiring lines of the first embodiment of the present invention can be fabricated as following:

At first, a first thin film of an oxide superconductor whose c-axis is oriented perpendicularly to a surface of a substrate is deposited on whole surface of the substrate. The substrate may have an additional buffer layer thereon.

Then, predetermined areas of the first thin film of oxide superconductor are removed to leave a pattern of first superconducting wiring lines. After then, a second thin film of the same oxide superconductor is deposited in such a condition that the second thin film is orientated differently from the first thin film on the surface of the substrate at areas where the first thin film of oxide superconductor has been removed. Namely, when the first thin film is a c-axis oriented thin film, an a-axis oriented thin film is deposited and when the first thin film is an a-axis oriented thin film, a c-axis oriented thin film is deposited. In the present invention, any one of the c-axis oriented thin film and the a-axis oriented thin film may be deposited firstly. In a practice, however, it is preferable to prepare firstly the c-axis oriented thin film in consideration of such a fact that a higher substrate temperature is required to prepare the c-axis oriented thin film.

Then, deoxygenation which will be described hereunder is effected on portions of the superconducting lines which will not be used as wiring lines so as to produce a final pattern of superconducting wiring.

In the superconducting circuit having the superconducting wiring lines according to second embodiment of the present invention, all of the superconducting wiring lines are made of c-axis oriented thin film of oxide superconductor and are separated by shield zones each made of an a-axis oriented thin film of the same oxide superconductor. In this case also, both of the a-axis oriented thin film and the c-axis oriented thin film co-exist in one layer and substantially no current flow between these two superconducting thin films even if these two thin films are juxtaposed because no substantial current is propagated between these two thin films. Therefore, if the superconducting wiring lines each made of the c-axis oriented thin film are produced in predetermined portions of the thin film of oxide superconductor while the shield zones each made of of the a-axis oriented thin film are produced at the remaining portions of the same thin film of oxide superconductor, crosstalk between adjacent superconducting wiring lines can be minimized and hence performance of superconducting wiring is improved. Still more, the density of wiring lines also can be increased.

It must be note that, although substantially no propagation of current occur when the propagation direction of a current passing through a superconducting wiring line is perpendicular to the c-axis of the shield zone, a current propagates from a superconducting wiring line to the shield zone when the current propagation direction becomes in parallel with the c-axis of the shield zone.

Therefore, in the latter case, it is necessary to arrange an insulation zone between the superconducting wiring line and the shield zone. The insulation zone can be produced easily by deoxygenation treatment or the other means.

The superconducting circuit having the superconducting wiring lines according to the second embodiment of the present invention can be fabricated as following:

At first, a first thin film of an oxide superconductor whose c-axis is oriented perpendicularly to a surface of the substrate. Then, predetermined areas of the first thin film of c-axis oriented oxide superconductor are removed to leave pattern of first superconducting wiring lines. After then, a second thin film of the same oxide superconductor is deposited in such a condition that the second thin film becomes an a-axis oriented thin film.

The processes according to the present invention have following merits:

(1) The properties of the thin film of oxide superconductor are not deteriorated during heat-treatment because both of the a-axis oriented thin film and the c-axis oriented thin film are made of an identical material.

(2) Fabrication of the other elements and/or wiring lines which will be effected on the superconducting circuit of the present invention is easy, because a surface of the final circuit having the superconducting wiring lines according to the present invention has a flat planar surface.

In summary, the first embodiment of the present invention provides a superconducting circuit having superconducting wiring lines made of thin films of oxide superconductor. In the superconducting circuit according to the present invention, both of superconducting lines for passing superconducting current in parallel with a surface of a substrate and of superconducting lines for passing superconducting current perpendicularly to and/or in parallel with the surface of the substrate can be arranged in a juxtaposed manner and viaholes can be formed in a layer which is common to the superconducting lines. Still more, since all of two superconducting lines each having a different function and the insulator zones as well as viaholes can be produced by an identical material, deterioration of superconducting properties of thin films of oxide superconductor caused by heat-treatment can be prevented.

In the second embodiment of the present invention, superconducting wiring lines for passing superconducting current in parallel with a surface of a substrate are separated by shield zones so that crosstalk between the superconducting wiring lines can be minimized. In other words, the wiring density can be increased. Still more, since both of the superconducting wiring lines and of the shield zones are produced by an identical material, deterioration of superconducting properties of thin films of oxide superconductor caused by heat-treatment can be minimized.

Now, the present invention will be described with reference to Examples but the scope of the invention should not be limited thereto.

DESCRIPTION OF THE PREFERRED EMBODIMENTS

Example 1

Figure 1:
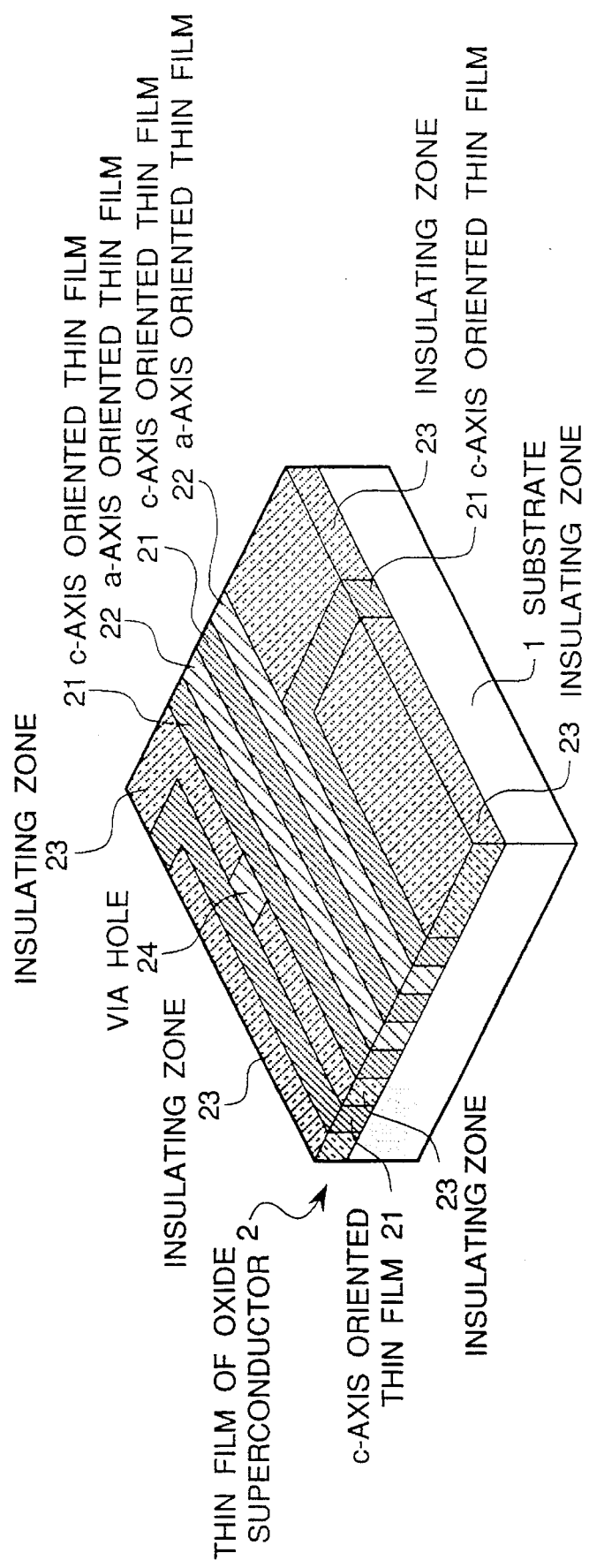
FIG. 1 is an illustrative perspective view of a superconducting circuit having superconducting wiring lines provided by the first aspect of the present invention.

FIG. 1 is an illustrative perspective view of an example of a superconducting circuit according to the first aspect of the present invention.

The superconducting circuit of FIG. 1 has a thin film layer 2 of oxide superconductor deposited on a substrate 1. The thin film layer 2 of oxide superconductor comprises c-axis oriented thin film zones 21, a-axis oriented thin film zones 22, insulation zones 23 in which superconductivity is lost and viaholes 24.

The c-axis oriented thin film zones 21 provide superconducting wiring lines in which a superconducting current propagates in parallel with a surface of the substrate 1. The a-axis oriented thin film zones 22 provide superconducting wiring lines in which superconducting current flow perpendicularly to and/or in parallel with the surface of the substrate 1.

Figure 2:
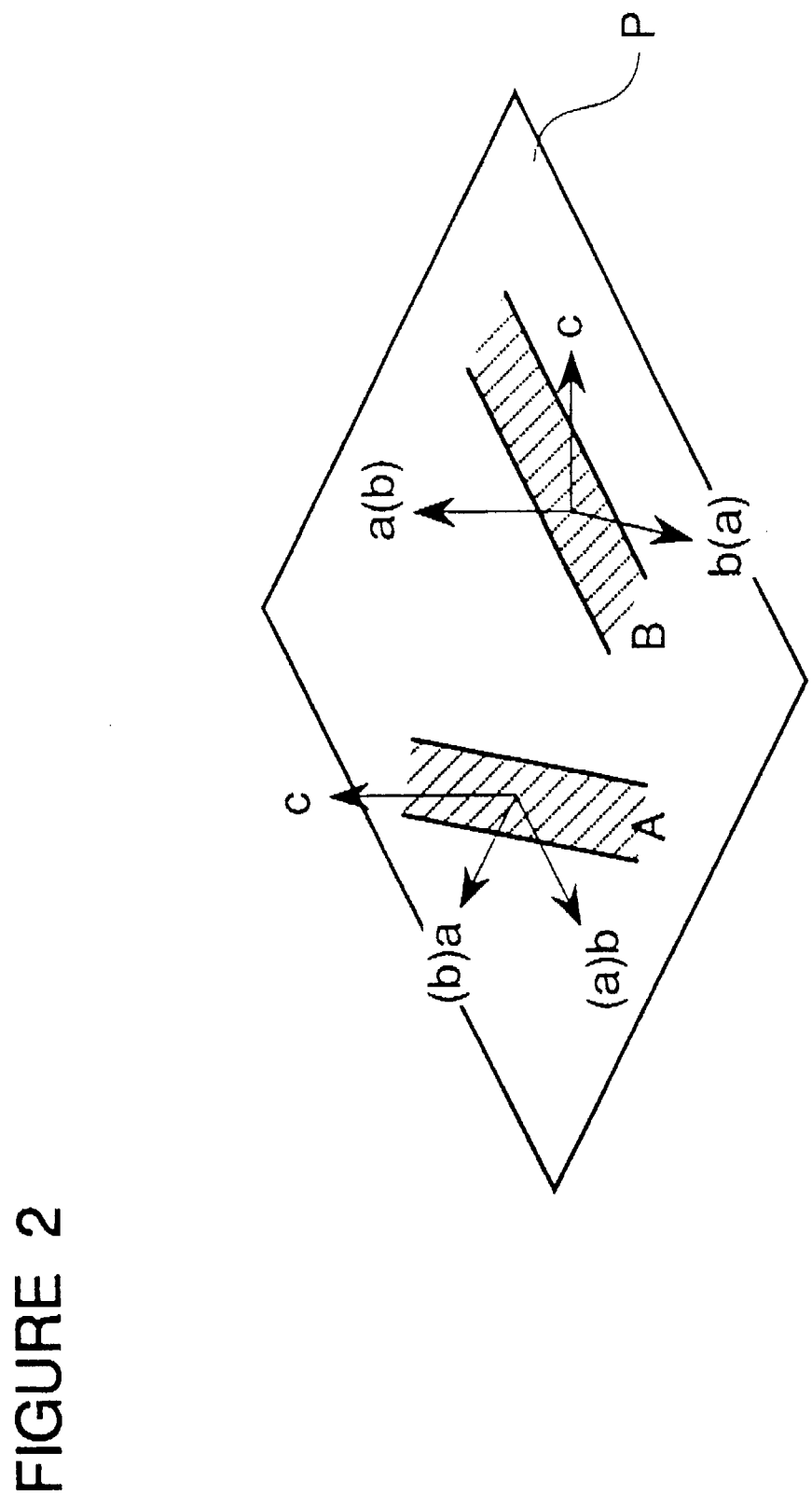
FIG. 2 is a drawing illustrating a relation in the directions of crystal orientation in two wiring lines shown in FIG. 1.

FIG. 2 is a drawing illustrating a relation in the directions of crystal orientation in two wiring lines A and B deposited on a plane P. The wiring line A corresponds to the c-axis oriented thin film zones 21 shown in FIG. 1, while the wiring line B corresponds to the a-axis oriented thin film zones 22 shown in FIG. 1. It should be noted that, in this example, there is no difference between the a-axis oriented thin film and a b-axis oriented thin film in the oxide superconductors to which the present invention is applicable because the oxide superconductors have layered structures in which superconducting current flow dominantly to a direction which is perpendicular to the c-axis.

In the insulation zones 23, no superconducting current flow. The viaholes 24 are used to connect layers in a stacked multi-layered circuit (not shown).

Example 2

FIGS. 3A to FIG. 3F are illustrative drawings showing successive steps for fabricating the superconducting circuit shown in FIG. 1. In this Example, a compound oxide superconductor of Y-Ba-Cu-O system is used as the oxide superconductor.

At first, a substrate 1 having a smooth surface is prepared. In this Example, the substrate 1 (FIG. 3A) consists of a silicon substrate 1a having a buffer layer 1b which is composed of an under-layer of $MgAl_2O_3$ having a thickness of 350 nm deposited by chemical vapour deposition (CVD) technique and an upper-layer of $BaTiO_3$ having a thickness of 75 nm deposited by sputtering technique. MgO (100) substrate, $CdNdAlO_4$ substrate or the like can be preferably used in place of the silicon substrate.

Figure 3A:
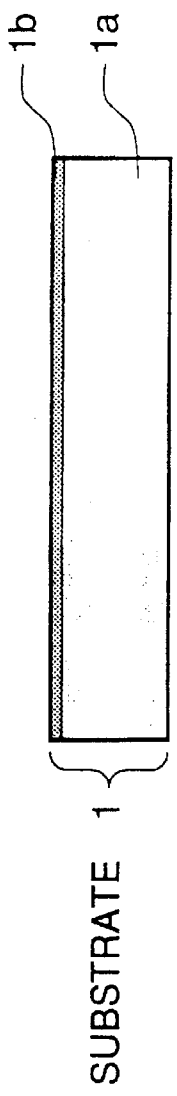
FIGS. 3A, 3B, 3C, 3D, 3E and 3F illustrate successive steps for fabricating the superconducting circuit shown in FIG. 1.
Figure 3B:
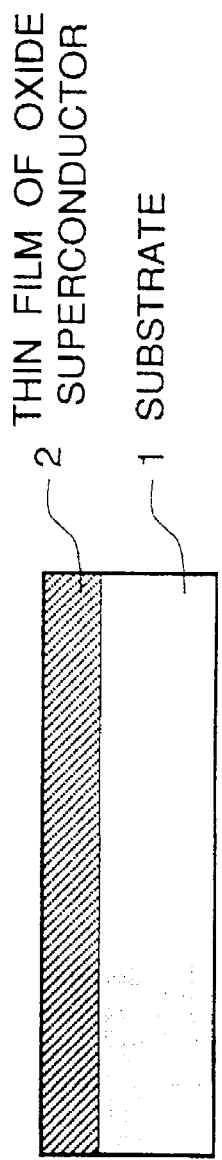

On the buffer layer of the substrate 1, a thin film 2 of oxide superconductor having a thickness of more than 200 nm as is shown in FIG. 3B is deposited. This thin film 2 can be prepared by an off-axis sputtering technique, a reactive evaporation technique or the like. In this Example, the thin film 2 of oxide superconductor is prepared by the off-axis sputtering technique under the presence of a mixed sputtering gas of $Ar+O_2$ (volume ratio of 9:1) of 10 Pa. The substrate is heated at 700° C. so that the crystals produce a c-axis orientated thin film of oxide superconductor in which c-axis is oriented perpendicularly to the surface of the substrate.

Figure 3C:
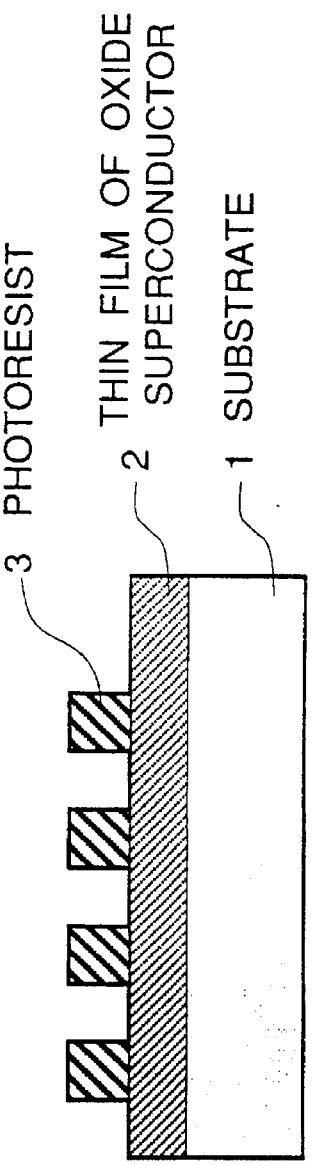

Then, as is shown in FIG. 3C, a photoresist layer 3 having a predetermined pattern is coated on the thin film 2 of oxide superconductor obtained.

Figure 3D:
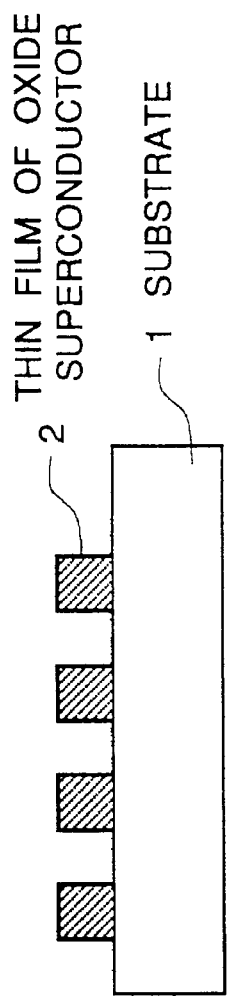

After the photoresist layer 3 is cured, exposed areas which are not covered with the photoresist 3 am removed by a dry-etching technique such as reactive ion etching and argon milling or by a wet etching technique such as treatment with phosphoric acid or hydrochloric acid in such a manner that patterned superconducting wiring lines 2c consisting of the c-axis oriented thin film and insulation zones 23 are left as is shown in FIG. 3D. The insulation zones 23 can be produced by deoxygenation treatment.

Figure 3E:
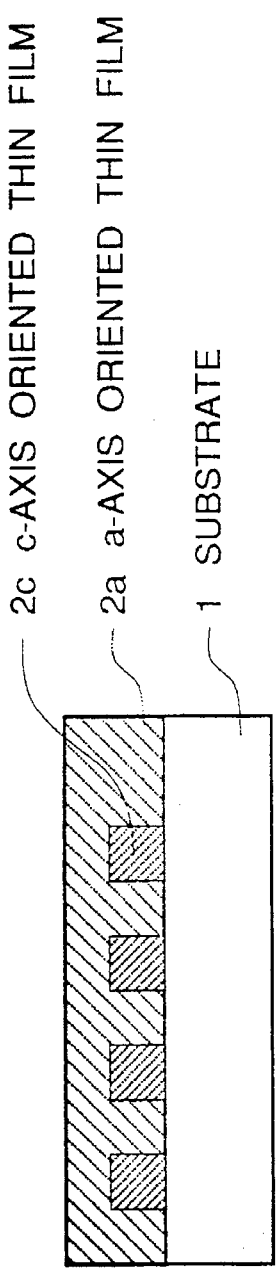

At the resulting etched areas, another superconducting wiring lines each being made of an a-axis oriented thin film will be produced in next stage. Thus, as is shown in FIG. 3E, an a-axis oriented thin film 2a of the same oxide superconductor is deposited on the surface of the substrate 1 on which the patterned superconducting wiring lines 2c consisting of the c-axis oriented thin film have been deposited. This thin film 2a of oxide superconductor also is prepared by the off-axis sputtering technique under the presence of a mixed sputtering gas of $Ar+O_2$ (volume ratio of 9:1) of 10 Pa but the substrate is heated at a temperature of lower than 650° C. so that the thin film of oxide superconductor 2a deposited becomes an aaxis oriented thin film.

Figure 3F:
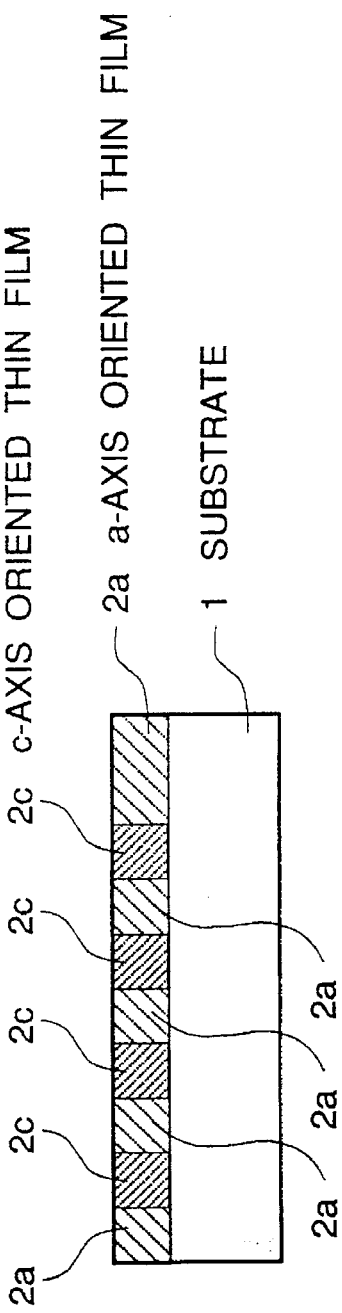

After then, a surface of the a-axis oriented thin film 2a is smoothed by a dry etching technique such is reactive ion etching or argon milling to obtain a superconducting circuit according to the present invention as is shown in FIG. 3F. Namely, both surfaces of the superconducting lines 2c made of c-axis oriented thin film and of the superconducting lines 2a made of a-axis oriented thin film make a planar flat surface or a common plane.

In practice, an interlayer insulator layer is deposited on the resulting superconducting circuit shown in FIG. 1 according to the present invention before the latter is passed to next stages for completing the superconducting circuit into a desired superconducting device.

The insulation zones 23 shown in FIG. 1 can be prepared by deoxygenation of the thin film 2 of oxide superconductor. Namely, after predetermined areas of the thin film 2 of oxide superconductor are protected with patterned photoresist or insulator, remaining exposed areas are subjected to a treatment of deoxygenation so that the exposed areas are changed into non-superconductor.

Example 3

Figure 4:
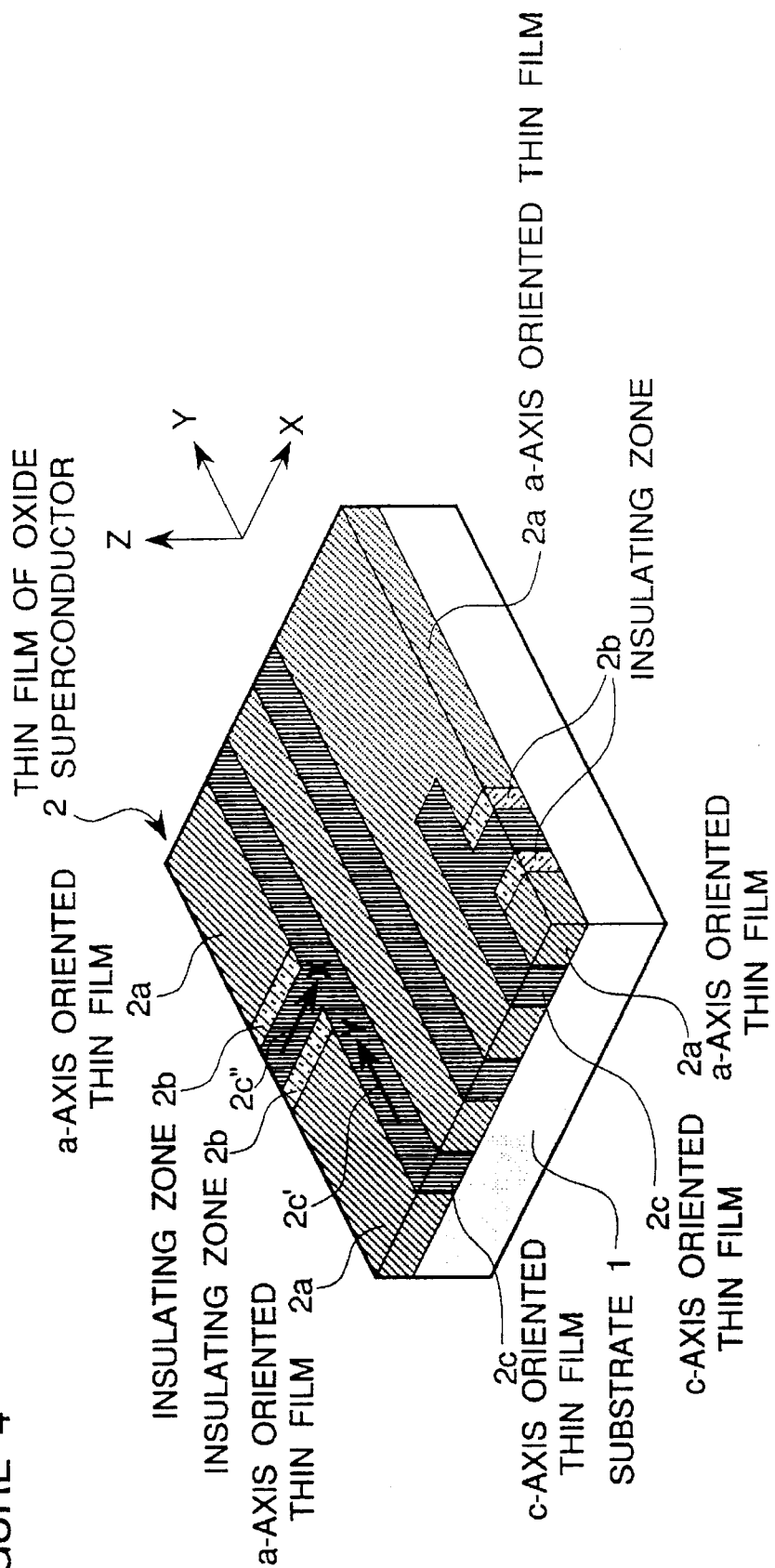
FIG. 4 is an illustrative perspective view of another embodiment of a superconducting circuit obtained by the present invention.

FIG. 4 is an illustrative perspective view of another example of the superconducting circuit according to the present invention.

The superconducting circuit of FIG. 4 has a thin film layer 2 of oxide superconductor deposited on a substrate 1. The thin film layer 2 of oxide superconductor comprises c-axis oriented thin film zones 2c, a-axis oriented thin film zones 2a and insulation zones 2b.

The c-axis oriented thin film zones 2c provide superconducting wiring lines in which a superconducting current propagates in parallel with a surface of the substrate 1. In this superconducting wiring lines 2c, superconducting current can flow along two directions "Y" and "X". Lines along the direction "Y" is called the first superconducting wiring line 2c', while lines along the direction "X" is collect the second superconducting wiring line 2c".

The a-axis oriented thin film zones 2a provide shield zones each functions as a shield to separate respective superconducting wiring lines 2c. In fact, the shield zones 2a prevent crosstalk between adjacent superconducting wiring lines 2c in which superconducting current can flow along any one of two directions "Y" and "X".

The insulation zones 2b are arranged at opposite sides of each second superconducting wiring line. The insulation zones 2b can be produced by deoxygenation treatment which is effected on selected portions of the a-axis oriented thin film 2a.

Example 5

FIGS. 5A to FIG. 5F are illustrative drawings showing successive steps for fabricating the superconducting circuit shown in FIG. 4. In this Example, a compound oxide superconductor of Y-Ba-Cu-O system is used as the oxide superconductor.

At first, a substrate 1 having a smooth surface is prepared. In this Example, the substrate 1 (FIG. 5A) consists of a silicon substrate 1a having a buffer layer 1b which is composed of an under-layer of $MgAl_2O_3$ having a thickness of 350 nm deposited by chemical vapour deposition (CVD) technique and an upper-layer of $BaTiO_3$ having a thickness of 75 nm deposited by sputtering technique. MgO (100) substrate, $CdNdAlO_4$ substrate or the like can be preferably used in place of the silicon substrate.

Figure 5A:
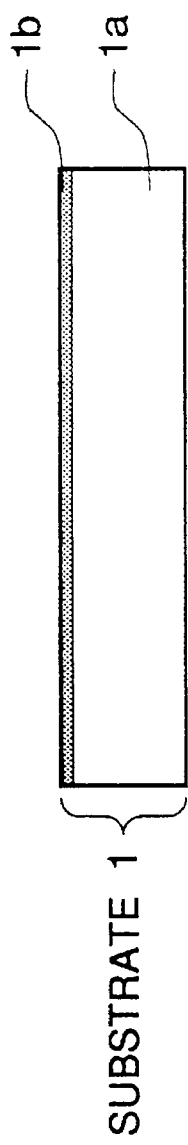
FIGS. 5A, 5B, 5C, 5D, 5E and 5F illustrate successive steps for fabricating a superconducting wiring pattern shown in FIG. 4 provided by the second aspect of the present invention.
Figure 5B:
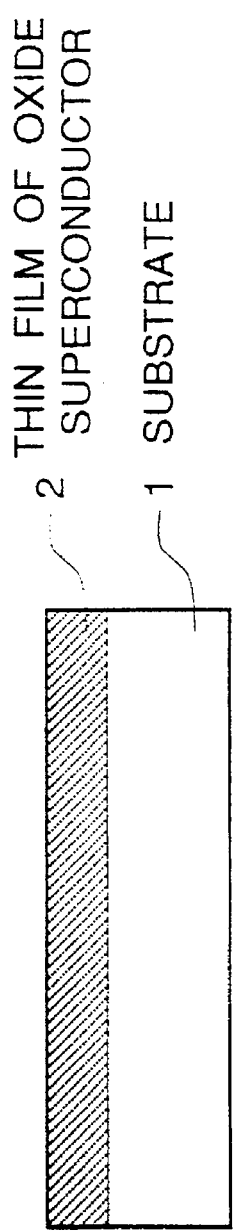

On the buffer layer of the substrate 1, a thin film 2 of oxide superconductor having a thickness of more than 200 nm as is shown in FIG. 5B is deposited. This thin film 2 can be prepared by an off-axis sputtering technique, a reactive evaporation technique or the like. In this Example, the thin film 2 of oxide superconductor is prepared by the off-axis sputtering technique under the presence of a mixed sputtering gas of $Ar+O_2$ (volume ratio of 9:1) of 10 Pa. The substrate is heated at a temperature which is higher than 700° C. so that the crystals deposited produce an c-axis orientated thin film of oxide superconductor in which c-axis is oriented perpendicularly to the surface of the substrate.

Figure 5C:
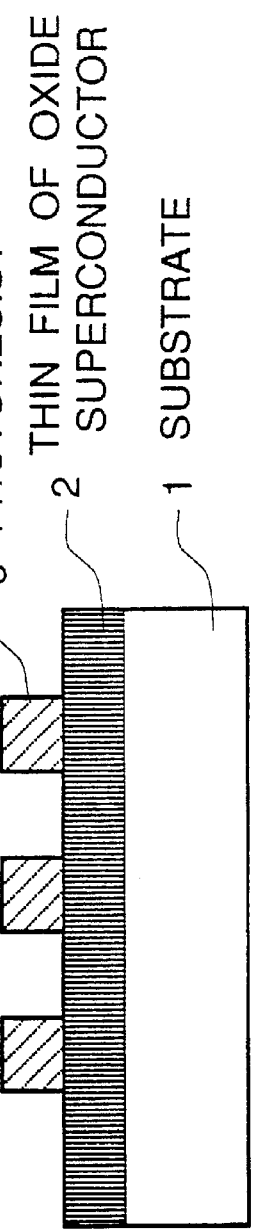

Then, as is Shown in FIG. 5C, a photoresist layer 3 having a predetermined patter is coated on the thin film 2 of oxide superconductor obtained.

Figure 5D:
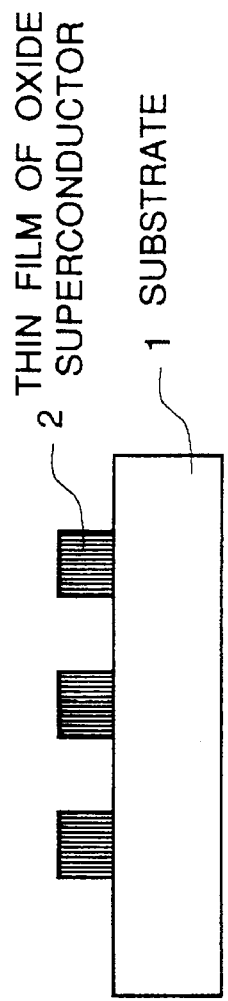

After the photoresist layer 3 is cured, exposed areas which are not covered with the photoresist 3 are removed by a dry-etching technique such as reactive ion etching and argon milling or by a wet etching technique such as treatment with phosphoric acid or hydrochloric acid so as to produce a patterned superconducting wiring lines 2c consisting of the c-axis oriented thin film as is shown in FIG. 5D.

Figure 5E:
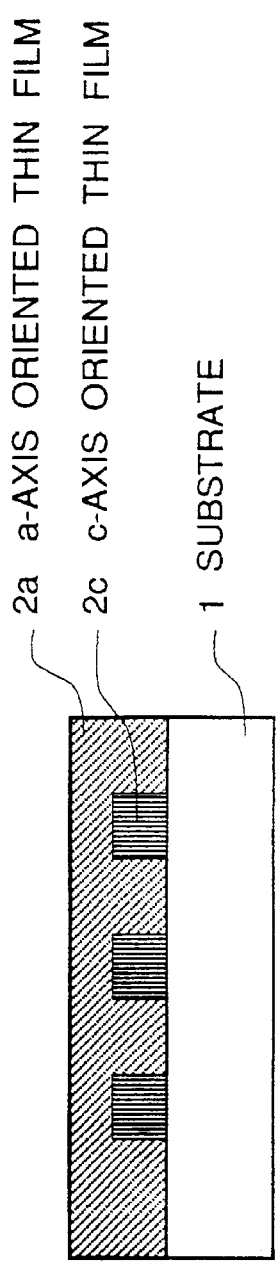

Then, as is shown in FIG. 5E, an a-axis oriented thin film 2a of the same oxide superconductor is deposited on the surface of the substrate 1 on which the patterned superconducting wiring lines 2c consisting of the c-axis oriented thin film have been deposited. This thin film 2a of oxide superconductor also is prepared by the off-axis sputtering technique under the presence of a mixed sputtering gas of $Ar+O_2$ (volume ratio of 9:1) of 10 Pa but the substrate is heated at a temperature which is not higher than 650° C. so that the thin film of oxide superconductor 2a deposited becomes a-axis oriented thin film. In this a-axis oriented thin film, it is preferable that its c-axis is also well-ordered.

Figure 5F:
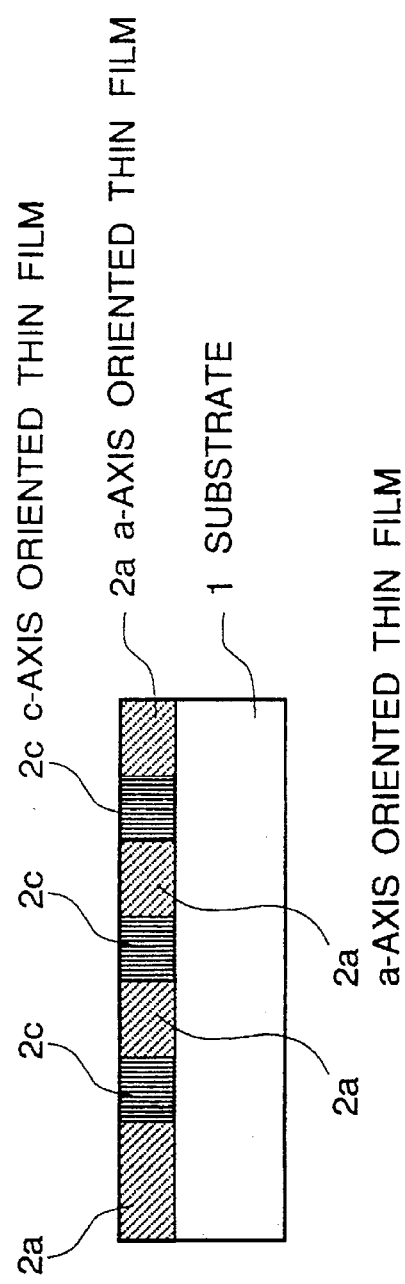

After then, a surface of the a-axis oriented thin film 2a is smoothed by a dry etching technique such as reactive ion etching or argon milling to obtain a superconducting circuit according to the present invention as is shown in FIG. 5F. Namely, both surfaces of the superconducting wiring lines 2c made of c-axis oriented thin film and of the shield zones 2a made of a-axis oriented thin film make a flat planar surface or a common plane.

In actual applications, an interlayer insulator layer is deposited on the resulting superconducting circuit shown in FIG. 4 according to the present invention before the latter is passed to next stages for completing the superconducting circuit into a desired superconducting device.

The insulation zones 2b shown in FIG. 4 can be prepared by deoxygenation treatment of the thin film 2 of oxide superconductor. Namely, after predetermined areas of the thin film 2 of oxide Superconductor am protected with patterned photoresist or insulator, remaining exposed areas are subjected to deoxygenation treatment so that the exposed areas are changed into non-superconductor. The deoxygenation treatment can be effected by local heating by means of a laser beam or a focussed ion beam.

We claim:

1. A process for fabricating a superconducting circuit, comprising depositing a first thin film of an oxide superconductor on a substrate such that the first thin film has a c-axis which is oriented perpendicular to a surface of the substrate, removing predetermined areas of said first thin film to expose a surface of said substrate and leave a pattern of first superconducting wiring lines, and depositing a second thin film of said oxide superconductor on said exposed surface of said substrate from which said first thin film has been removed to produce second superconducting wiring lines, the a-axis of said second thin film being oriented perpendicular to said first superconducting wiring lines and in parallel with said surface of the substrate.

2. A process for fabricating a superconducting circuit, comprising:

depositing a first thin film of an oxide superconductor on a substrate, such that the first thin film has an a-axis or c-axis which is oriented perpendicular to a surface of the substrate, removing predetermined areas of said first thin film to leave a pattern of first superconducting lines, and depositing a second thin film of said oxide superconductor, said second thin film being an a-axis oriented or c-axis oriented thin film which is oriented differently from said first thin film on said surface of the substrate, at remaining areas from which said first thin film has been removed.

3. A process for fabricating a superconducting circuit set forth in claim 2, further including the step of forming an insulation zone at a predetermined portion of said first or second thin films, said portion corresponding to an interface between said first and second thin films.

4. The process set forth in claim 3, wherein said insulation zone is produced by deoxygenation treatment.

5. The process set forth in claim 4, wherein said deoxygenation treatment is effected by vacuum annealing, a laser beam or a focussed ion beam.

* * * * *